United States Patent [19]

Hoshi

[11] 3,755,763

[45] Aug. 28, 1973

[54] FM-AM PRESET TUNING DEVICES

[75] Inventor: Juro Hoshi, Hamamatsu, Japan

[73] Assignee: Nippon Bakki Seizo Kabushiki Kaisha, Shiznoka-ken, Japan

[22] Filed: Mar. 23, 1971

[21] Appl. No.: 127,220

[52] U.S. Cl. .................... 334/1, 323/80, 325/315, 325/455, 325/459, 325/465, 334/15, 334/87

[51] Int. Cl. .................... H03j 5/04

[58] Field of Search .................... 334/1, 15, 7, 86, 334/87; 325/315, 316, 370, 422, 459, 461, 462, 464, 465, 468

[56] References Cited

UNITED STATES PATENTS

| | | | |
|---|---|---|---|
| 3,201,695 | 8/1965 | Mason et al. | 325/315 |
| 3,593,152 | 7/1971 | Aoki | 334/7 X |
| 3,517,352 | 6/1970 | Marshall et al. | 334/15 |
| 3,440,544 | 4/1969 | Pampel | 334/15 UX |
| 3,503,018 | 3/1970 | Cavanagh | 334/15 |
| 3,505,620 | 4/1970 | Miner | 334/15 |

*Primary Examiner*—Paul L. Gensler
*Attorney*—Curt M. Avery, Arthur E. Wilfond, Herbert L. Lerner and Daniel J. Tick

[57] ABSTRACT

The FM-AM preset tuning device comprises an FM tuner including a plurality of tank circuits each having a variable capacitance diode; an AM tuner similarly constructed as the FM tuner; preset means including a plurality of voltage adjusters to adjust the voltages to be impressed upon respective variable capacitance diodes included in the tank circuits of the FM and AM tuners for pretuning respective tank circuits to the frequencies of respective FM and AM broadcasting stations to be selected, and a plurality of switches each associated with different one of the voltage adjusters; and at least one FM-AM changeover switch connected between the FM and AM tuners and the preset means for selectively connecting the preset means to either one of the FM and AM tuners.

7 Claims, 10 Drawing Figures

INVENTOR.

Juro Hoshi

INVENTOR.

Juro Hoshi

INVENTOR.

INVENTOR.

Juro Hoshi

INVENTOR.

Iuro Hoshi

INVENTOR.

Juro Hoshi

INVENTOR.

Juro Hoshi

INVENTOR.

Juro Hoshi

FM-AM PRESET TUNING DEVICES

This invention relates to an FM-AM preset tuning device for presetting the frequency to be received by an FM-AM radio receiver.

In the known FM-AM radio receiver, a desired program broadcasted by a particular broadcasting station has been selected by mechanically rotating the rotary armatures of air variable capacitors in the tank circuits respectively included in a radio frequency amplifier circuit, a local oscillator circuit and a frequency connecter circuit. Recently, an electronic tuning system has been developed utilizing a variable capacitance diode (hereinafter designated as the "Varicap") wherein the capacitance at the p-n junction of a semiconductor body varies in accordance with the inversely applied voltage. Both manual and preset tuning in a radio receiver is simplified by employing such a Varicap.

In the case of the manual tuners, the movable arm of a variable resistor is rotated by the control knob to vary the voltage impressed upon the Varicap for selecting the desired broadcasting station. This manipulation is quite the same as with tuners employing conventional frequency selection systems utilizing variable capacitors.

In the case of preset tuning, a plurality of preset units are provided, and in each unit the voltage to be impressed upon a Varicap is preset by means of a variable resistor for a desired broadcasting station. With this preset tuning, any desired station can be selected by merely closing a switch associated therewith to connect a preset voltage to the Varicap.

With preset tuning, the number of stations that can be preset is determined by the number of preset units. Accordingly, where it is desired to preset five FM stations and five AM stations, it is necessary to provide 10 preset units. In other words, ten sets of the variable resistors, switches control knobs and dials are required, thus complicating the construction of such a receiver, thus increasing the cost and the physical size thereof.

In certain locations, there are only one or two available FM stations a far greater number of AM stations, in spite of the fact that a substantial number of users wish to receive FM stations rather than AM stations. Since the number of stations frequently received are limited to either band and to provide separate preset units in numbers sufficient for both FM and AM bands, respectively, to meet everyone's demand for AM and FM band is quite uneconomical.

It is therefore an object of this invention to provide a novel FM-AM preset tuning device by which the user can select any desired number of FM broadcasting stations and AM broadcasting stations within a predetermined total number of such FM and AM stations.

Another object of this invention is to provide a novel FM-AM preset tuning device of simple circuit construction, and easy to operate wherein each individual preset unit being selectively available for use with the FM and AM tuners, respectively by manipulating a FM-AM change-over switch.

A further object of the present invention is to provide a new and improved preset tuning device wherein selected stations of the FM and AM broadcasting bands can be displayed on a common scale.

According to this invention, there is provided an FM-AM preset tuning device comprising an FM tuner including tank circuits each having a tuning frequency determining element controlled by a d. c. voltage impressed thereto; an AM tuner including a plurality of tank circuits each having a tuning frequency determining element controlled by a d. c. voltage impressed thereto; a plurality of presetting units each including a voltage adjuster to adjust the d.c. voltage to be impressed upon respective tuning frequency determining elements included in the tank circuits of the FM tuner and the AM tuner, for pretuning respective tank circuits to the frequencies of respective FM and AM broadcasting stations to be selected, and a plurality of switches each associated with different one of the voltage adjusters; and at least one FM-AM change-over switch connected between the FM and AM tuners and preset units for selectively connecting the preset units to either one of the FM and AM tuners.

The preset member may be modified in various ways. For example, the FM-AM change-over switch may be connected between the tuners (FM and AM) and each voltage adjuster or variable resistor in the preset units. In one example, the variable resistor has its mid point connected to one side of a source and its opposite ends connected to the other side of the source in which case, movement of the sliding arm away from the mid point in one direction permits FM preset.

Alternatively, the variable resistor may comprise two sections which are connected in parallel across the sources. With these variable resistors, the scale board for indicating the frequency can be graduated with a scale including two sections, one for AM and the other for FM.

Figures 1, 2:
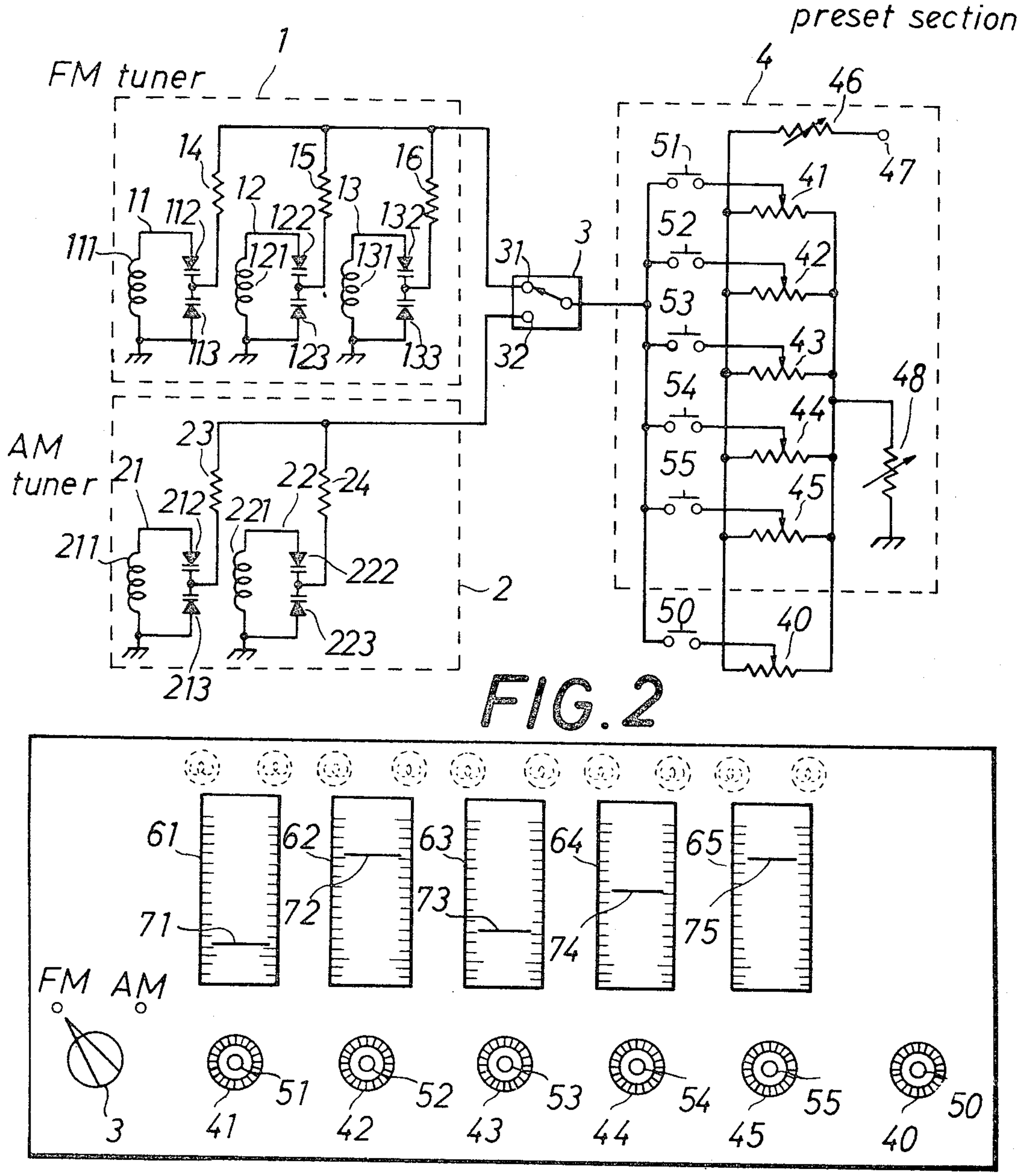
FIG. 1 shows a connection diagram of one embodiment of the FM-AM preset tuning device embodying the invention.
FIG. 2 shows a schematic view of a control panel utilized in the device shown in FIG. 1.

The FM-AM preset tuning device shown in FIG. 1 comprises an FM tuner 1 including a plurality of FM tuning tank circuits 11, 12 and 13. Tank circuits 11 and 12 are tuning circuits for radio frequency amplifier circuits whereas the tank circuits 13 is a tuning circuit for a local oscillator. Tank circuit 11 is comprised of an inductance coil 111 and a pair of Varicaps 112 and 113 connected series in back-to-back relation. Similarly, tank circuits 12 and 13 are comprised of inductance coils 121 131 and Varicaps 122, 123, and 132, 133, respectively, connected in the same manner as in tank circuit 11. Junctures between Varicaps 112 and 113, 122 and 123 and 132 and 133 are connected to one terminal 31 of a FM-AM change-over switch 3 through resistors 14, 15 and 16 respectively.

There is also provided an AM tuner 2 comprising an AM tuning tank circuit 21 for a radio frequency amplifier circuit and an AM tuning tank circuit 22 for a local oscillator. Similar to tank circuit 11, 12 and 13, tank circuits 21 and 22 are comprised of inductance coils 211 and 221 and Varicaps 212, 213 and 222, 223 are connected in series opposition, respectively. Junctures between Varicaps 212, 213 and 222, 223 are connected to terminal 32 of the change-over switch 3 through resistors 23 and 24, respectively.

A preset section 4 comprises a plurality of variable resistors 41 through 45 for presetting, a designated number of variable resistors as determined by the maximum total number of the FM and AM broadcasting stations desired to be selected. One end of preset variable resistors 41 through 45 respectively and of variable resistor 40 (used for manual tuning) are connected to a source terminal 47 via variable resistor 46 for adjusting the maximum voltage, terminal 47 being connected to the positive pole of a d.c. source, not shown. The opposite ends of resistors 40 through 45 respectively grounded through another variable resistor 48 (for adjusting the minimum voltage). The movable or slidable taps of resistors 40 through 45 are connected to the movable contact of the change-over switch 3 through push button switches 50 through 55, respectively. The push button switches 51 through 55 are used together with variable resistors 41 through 45, respectively, while push button switch 50 is used for mannual tuning in conjunction with variable resistor 40. It is to be understood that push button switches 50 through 55 are interlocked such that two or more of them can not simultaneously be operated by a suitable mechanism (i.e., lock and release type). Thus, for example, when switch 51 is operated all of the remaining switches are released back to their inoperative state. In the same manner, when switch 50 for manual tuning is closed, switches 51 through 55 are held open.

In the case where change-over switch 3 is positioned to contact 31 for FM reception and switch 51 is closed, then variable resistor 41 is adjusted the voltage impressed upon various Varicaps 112, 113, 122, 123: 132, 133 of tank circuits 11, 12 and 13 in FM tuner 1 and are adjusted simultaneously to thereby enable tank circuits 11, 12 and 13 to select a first FM broadcasting station.

When the movable contact of FM-AM change-over switch 3 is switched to the AM side 32 and switch 51 is closed, then variable resistor 41 is adjusted and the voltages impressed upon tank circuits 21 and 22 in the AM tuner 2 are adjusted simultaneously to, thereby enable tank circuits 21 and 22 to select a first AM broadcasting station.

In the same manner, by the switchable adjustments of resistors 42, 43 . . . etc. second, third . . .etc. FM stations or second, third . . . etc. AM stations can be selected by tank circuits 11, 12 and 13 or tank circuits 21 and 22 depending upon the position of the contact at the change-over switch 3.

When push button switch 50 is closed, variable resistor 40 is adjusted by a tuning knob, and any desired FM or AM station is selected by the manipulation of the tuning knob irrespective of the above mentioned FM or AM preset settings.

FIG. 2 shows a front view of a panel board of FM-AM receiver carrying various elements of the preset section 4 and FM-AM change-over switch 3. As shown, change-over switch 3 is mounted near the left lower edge of the panel board. The operating shafts of push button switches 50 through 55 are arranged in a horizontal line with proper spacings between each of them. Further, the operating knobs of variable resistors 40 through 45 are arranged concentric with and around respective operating shafts of switches 50–55. Vertical rectangular scale boards 61 through 65 are provided above such variable resistors. The lefthand and righthand vertical edges of each scale board are graduated with FM and AM broadcasting frequencies. Scale boards 61 through 65 are also provided with pointers 71 through 75, respectively, which are interlocked with movable taps of variable resistors 41 through 45 so as to be moved in the vertical direction.

The movable tap of variable resistor 40 is operated by a manual tuning knob and is interlocked with the pointer of the scale board (not shown) for manual tuning.

As shown by dotted lines, switch display lamps suitably connected and interlocked with FM-AM change-over switch 3 are provided for each scale board to display whether an FM or an AM station is now being selected.

The operation of the novel FM-AM present tuning device is as follows: For illustrative purposes only, it is assumed that two FM stations and 3 AM stations are to be preset.

Under these conditions, FM tuner 1 is adjusted to the frequencies of the first and the second FM stations by adjusting variable resistors 41 and 42, whereas AM tuner 2 is adjusted to tune to the frequencies of the first to third AM stations by adjusting variable resistors 43, 44 and 45. When so adjusted pointers 71 and 72 of scale boards 61 and 62 will indicate frequencies of the first and second FM stations while pointers 73, 74 and 75 of scale boards 63, 64 and 65, the frequencies of the first, second and third AM stations. When the movable contact of AM-FM change-over switch 3 is switched to the FM side it becomes possible to select FM stations and upon closure of push button switch 51, the first FM station can be selected at once. Under these conditions, push button switches 52 through 55 are held open to prevent another stations from being selected.

Then, when push button switch 52, for example, is closed, the second FM station will be selected.

To select an AM station, FM-AM change-over switch 3 is transferred to the AM side 32. Then, preset section 4 can select any one of the AM stations. For example, the operation of switch 53 selects the first AM station and independent operation of switches 54 and 55 select the second and third AM stations.

If, for example, four FM stations and one AM station are required to be preset, then variable resistors 41 to 44 are adjusted such that FM tuner 1 tunes to the frequencies of the first to fourth FM stations and variable resistor 45 is adjusted to cause AM tuner 2 to tune to the frequency of the first AM station.

Then, by transferring FM-AM change-over switch 3 to the FM side 31 and by closing either one of switches 51 through 54, one of the first to fourth FM stations can be selected.

To select first AM station, the FM-AM change-over switch 3 is transferred to the AM side 32 and switch 55 is closed.

It is to be understood that the number of FM stations and AM stations to be preset is not limited to the particular number described above and that such number may be determined by the user. Furthermore, it is to be understood that resistors 40 through 45 may be replaced by any other conventional voltage adjusters.

Instead of utilizing two Varicaps connected in series opposition in each tank circuit, one of the Varicaps may be replaced by a fixed capacitor. Further, the number of preset units is not limited to five.

From the foregoing description it will be clear that according to this invention, the station selection on both the FM and AM can be preset by a common voltage adjuster, instead of utilizing two independent voltage adjusters as in the prior art. Thus, by transferring the FM-AM change-over switch to either the FM side or AM side and by operating appropriate switches of the preset member, it is possible to select any desired broadcasting station to which the receiver has been preset. Thus, the novel device can be operated very readily, has a simple circuit construction and reduced size, and can be manufactured at low cost.

In the following embodiment, one FM-AM change-over switch is provided for each preset unit. The dial mechanism of the receiver displays the broadcasting mode as the switch is transferred to receive an FM broadcasting station or an AM station, respectively.

Figure 3:
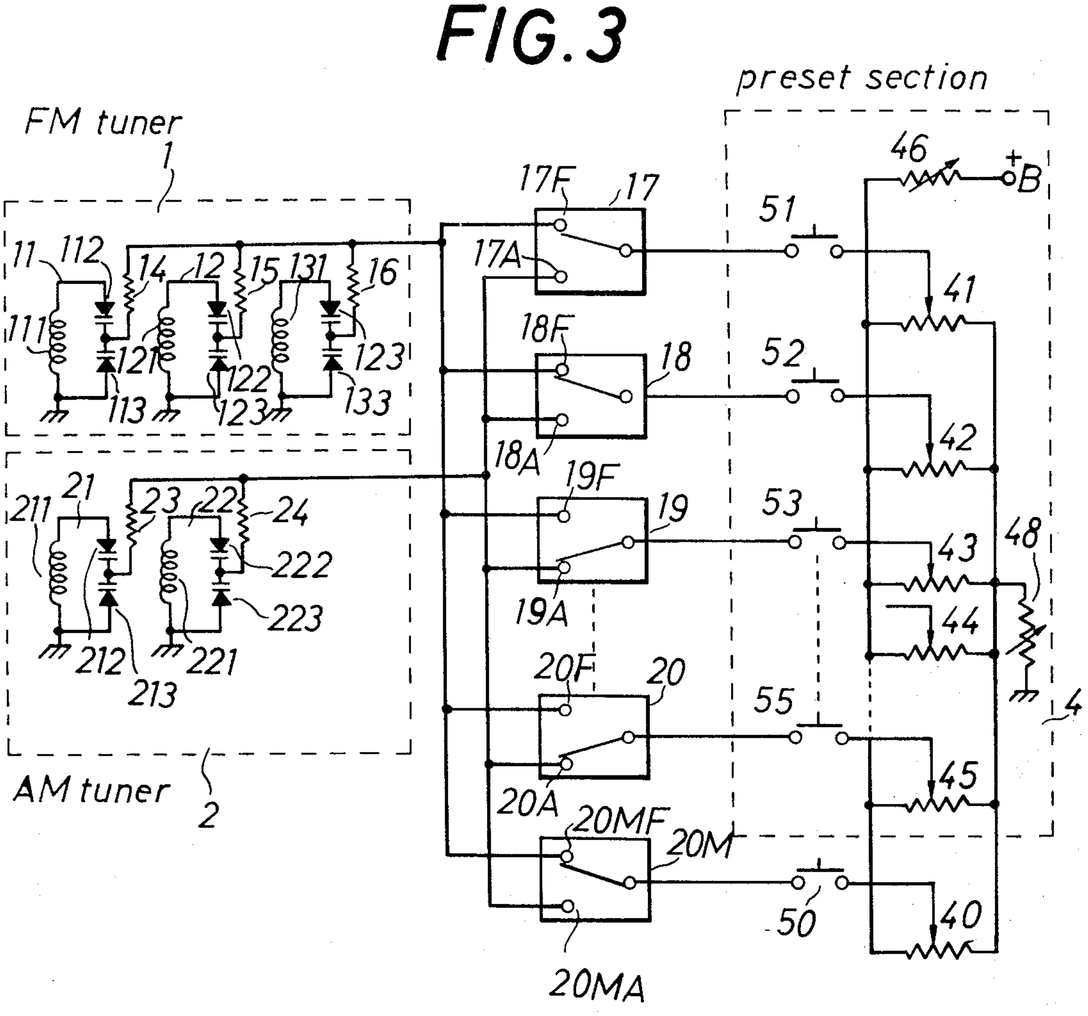
FIG. 3 shows a connection diagram of a modified embodiment of this invention.

Thus, in the embodiment shown in FIG. 3 the AM and FM tuners 2 and 1 and the preset section 4 are constructed in the same manner as those shown in FIG. 1. Corresponding elements of these two embodiments are designated by the same reference numerals. However, there are provided a plurality of FM-AM change-over switches 17, 18, 19 and 20 of the number equal to the number of FM and AM broadcasting stations desired to be received and an FM-AM change-over switch 20M for manual tuning. In this case, junctures between pairs of Varicaps 112, 113: 122, 123: 132, 133; of the FM tuner 1 are commonly connected to the upper terminals (FM side) 17F, 18F, 19F, 20F and 20MF of respective FM-AM change-over switches respectively through resistors 14, 15 and 16. In the same manner, junctures between Varicaps 212, 213 and 222, 223 of the AM tuner 2 are commonly connected to the lower terminals (AM side) 17A, 18A, 19A, 20A and 20MA of respective change-over switches respectively through resistors 23 and 24. Further, according to this modification, the left hand terminals of push button switches 50 to 55 inclusive are connected to the movable contacts of respective change-over switches.

Again, these push button switches are interlocked each other as has been described in connection with FIG. 1.

Figure 4:
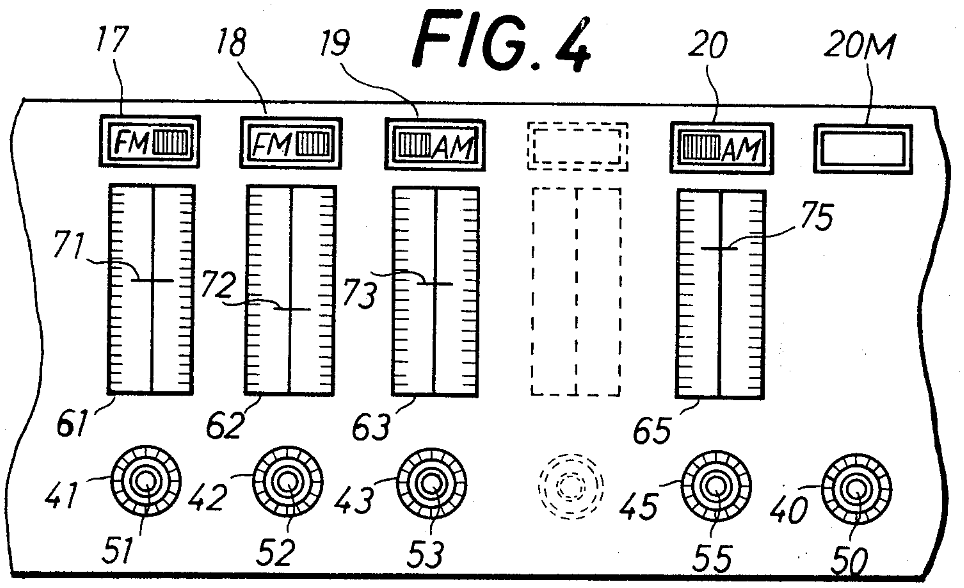
FIG. 4 shows a front view of a panel board utilized in a radio receiver using the circuit shown in FIG. 3.

FIG. 4 shows one example of a panel board utilized in the receiver shown in FIG. 3 which is generally identical to that shown in FIG. 2 except that FM-AM change-over switches 17, 18, 19 and 20 are positioned above respective scale boards 61 through 65 and the change-over switch 20M for mannual tuning is mounted in line with switches 17 to 20.

Figure 5:
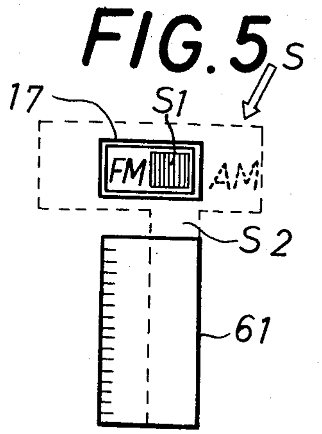
FIG. 5 shows a front view of a scale board and a FM-AM change-over switch utilized in the panel board shown in FIG. 4.

FIG. 5 shows the detail of one of the scale boards, for example 61 and one of the change-over switches, 17. More particularly, the change-over switch comprises a slide switch generally shown by S. When the knob S is moved to the right as viewed in FIG. 5 a symbol "FM" is presented to a window and the switch is transferred to the FM side. On the other hand, when the knob $S_1$ is moved to the left the switch is transferred to the AM side and a symbol "AM" is displayed. Further, a letter T shaped shield plate $S_2$ (shown by broken line) is connected to knob $S_1$ to move therewith. Accordingly, when the switch 17 is transferred to the FM side the AM scale of the scale board 61 (righthand side thereof) is shielded whereas when the switch 17 is transferred to the AM side the FM scale (lefthand scale) is shielded.

Presetting and selection of FM and AM broadcasting stations can be performed in the same manner as in the first embodiment.

If desired, suitable lamps interlocked with FM-AM change-over switches may be provided as shown by dotted lines in FIG. 2 to respectively illuminate symbols FM and AM of slide switches S.

Figure 6:
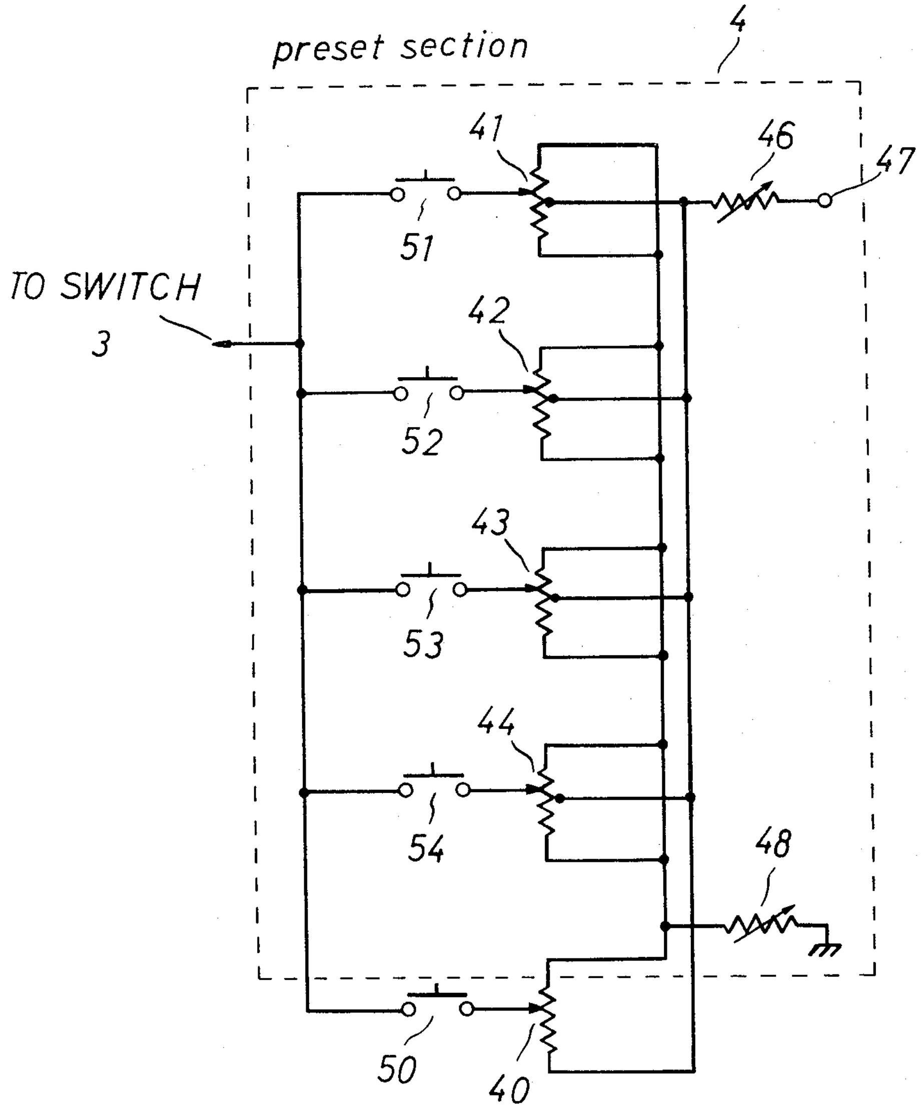
FIG. 6 shows a connection diagram of a portion of a modified preset member.
Figure 7:
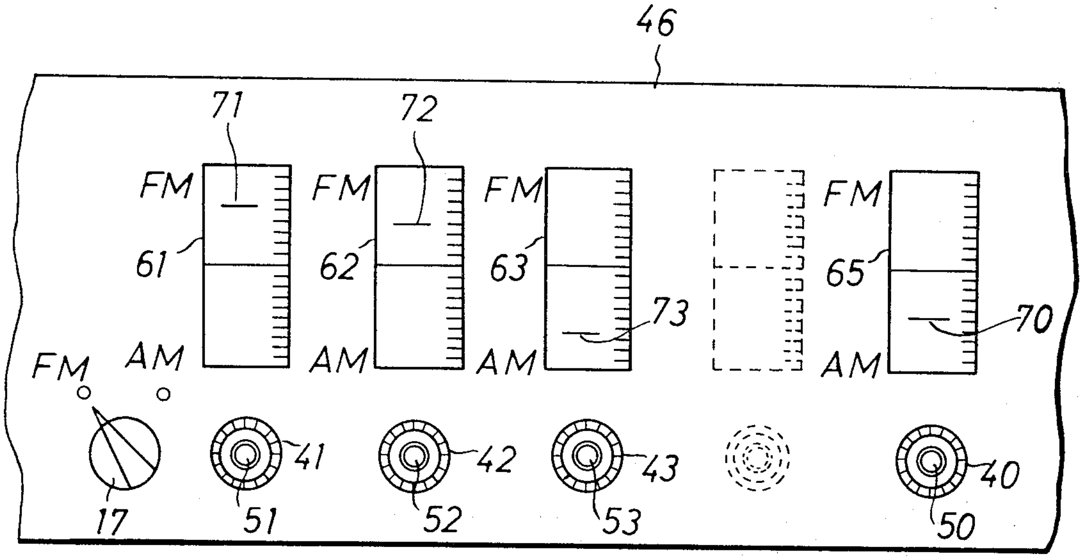
FIG. 7 shows a front view of the panel board of receiver utilizing the preset member shown in FIG. 6.

FIGS. 6 and 7 show another modification of this invention wherein a special scale board is used for clearly displaying the preset tuning of FM and AM broadcasting stations on a common scale.

In this embodiment, the preset section 4 is modified as shown in FIG. 6. Thus, each one of variable resistors 41 through 44 for preset tuning is connected across resistors 46 and 48 and is provided with a sliding arm. The sliding arm of these resistors are respectively connected to the movable contact of FM-AM change-over switch 3 (see FIG. 1) via push button switches 51 to 54 respectively and the mid points of these variable resistors are connected to the positive terminal 47 through resistor 46. However, resistor 40 for manual tuning is connected across resistor 46 and 48 and its sliding arm is connected to the movable contact of change-over switch 3 through push button switch 50 as in FIG. 1.

When the sliding arms of respective resistors 41, 42, 43 and 44 are moved upwardly as viewed in FIG. 6, the tank circuits 11, 12 and 13 of FM tuner 1 (FIG. 1) are tuned by, the proper connection of switch 3 to the frequencies of respective FM broadcasting stations, whereas, the tank circuits 21 and 22 of AM tuner 2 are tuned by, the proper connection of the switch 3, to the frequencies of respective AM broadcasting stations.

FIG. 7 shows a panel board used in this embodiment. The relative arrangement of the sliding arms of resistors 40 to 43, push buttons 50 to 53 and scale boards 61 to 65 is the same as that shown in FIG. 2. However, only one side of each of the scale boards is graduated with an FM scale on the upper half and an AM scale on the lower half.

The FM scale FM is graduated such that the frequency decreases from the center to the upper side; whereas; the AM scale AM is graduated such that the frequency decreases from the center to the lower side; pointers 70 to 73 are interlocked with sliding arms of resistors 40 to 43 respectively. This modified scale board indicates whether the receiver is receiving an FM broadcasting station or an AM broadcasting station by the position of the pointer thereby omitting the necessity of using switch S shown in FIG. 5.

Figure 8:
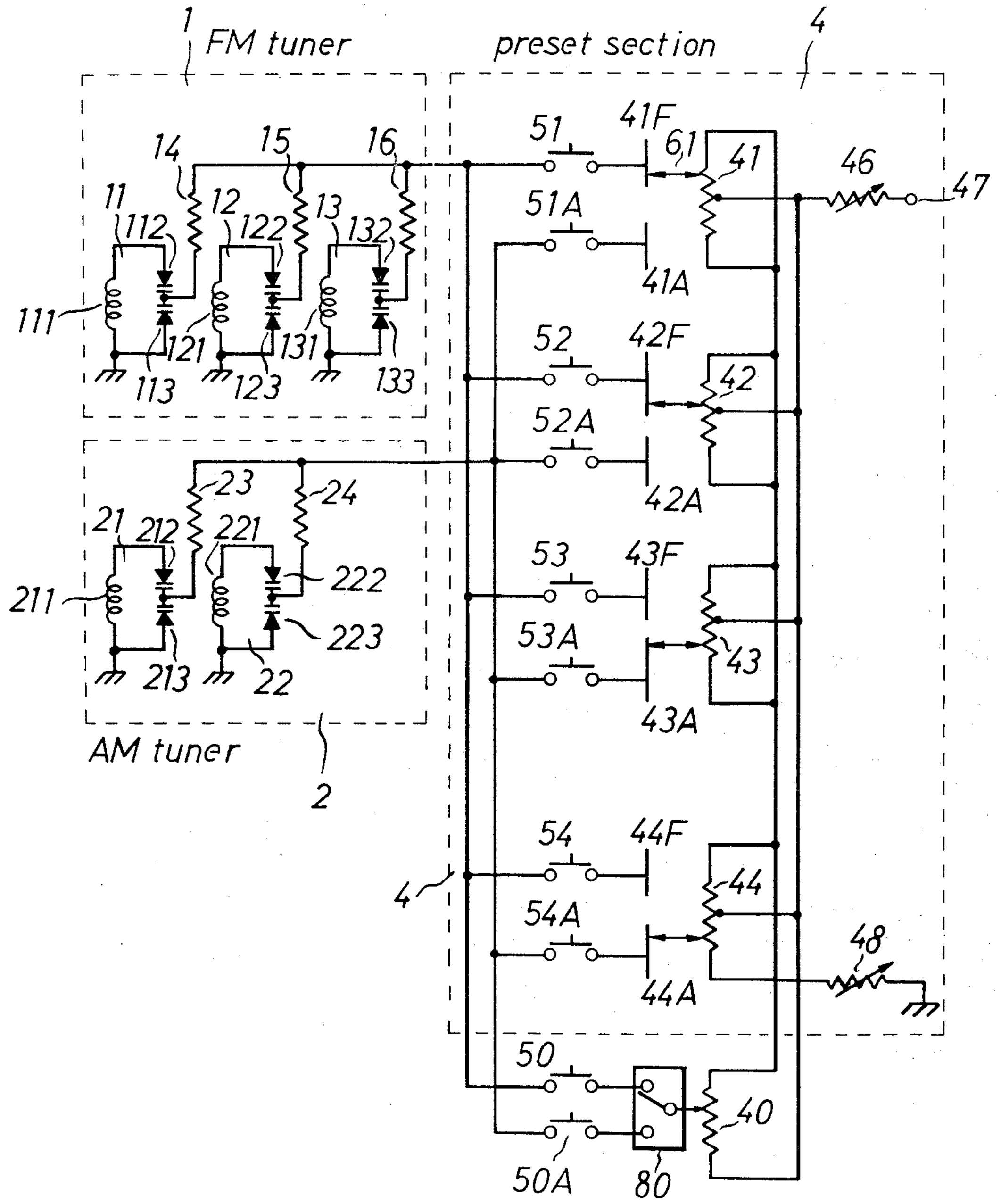
FIG. 8 shows a connection diagram of still another embodiment of this invention.

In another embodiment shown in FIG. 8, the FM tuner 1 and the AM tuner 2 have the same construction as that of the first embodiment. The variable resistors 40 to 44 of the preset section 4 are connected in the same manner as has been described in connection with FIG. 6. These variable resistors 40 to 44 are provided with parts of contact pieces 41F, 41A; 42F, 42A; 43F, 43A; and 44F, 44A, respectively, which are arranged to be selectively engaged by their sliding arms. The sliding arm of variable resistor 40 for manual setting 40 is connected to the movable contact of an FM-AM change-over switch 80. Push button switches 51, 52, 53 and 54 are connected between the FM tuner 1 and contact pieces 41F, 42F, 43F and 44F, respectively, whereas push button switches 51A, 52A, 53A and 54A are connected between the AM tuner 2 and contact pieces 41A, 42A, 43A and 44A, respectively. Push button switch 50 is connected between the FM tuner 1 and the upper stationary contact of change-over switch 80 while push button switch 50A is connected between AM tuner 2 and the lower stationary contact of change-over switch 80. These push button switches are interlocked such that whenever one of their kind is operated, another is rendered inoperative. For example, when push button switches 51 and 51A are closed, 52, 52A; 53, 53A; 54, 54A and 50, 50A are in a de-energized state.

When sliding arms of resistors 41, 42, 43 and 44 are moved upwardly along contact pieces 41F, 42F, 43F and 44F, tank circuits 11, 12 and 13 of the FM tuner 1 can be tuned to the frequencies of the FM broadcasting stations to be selected. When these sliding arms are moved downwardly along contact pieces 41A, 42A, 43A and 44A, the tank circuits 21 and 22 of the AM tuner 2 are tuned to the frequencies of respective AM broadcasting stations. The FM-AM change-over switch 80 is used in the same manner as the FM-AM change-over switch 3 shown in FIG. 1, only for manual tuning by variable resistor 40.

The panel board of this modified receiver may be identical to that shown in FIG. 7. Thus, only one side of each scale board is graduated with an FM scale on the upper half and an AM scale on the lower half.

The operation of the circuit shown in FIG. 8 is generally similar to that of the circuit shown in FIG. 1. Although each pair of push buttons, for example 51 and 51A, are closed simultaneously, an FM tuner 1 and AM tuner 2 are preset independently, since contact members 41F and 41A are closely spaced apart. It will thus be seen that each sliding arm and two contact members associated therewith, function to change the connection between the variable resistor and FM and AM tuners.

Figure 9:
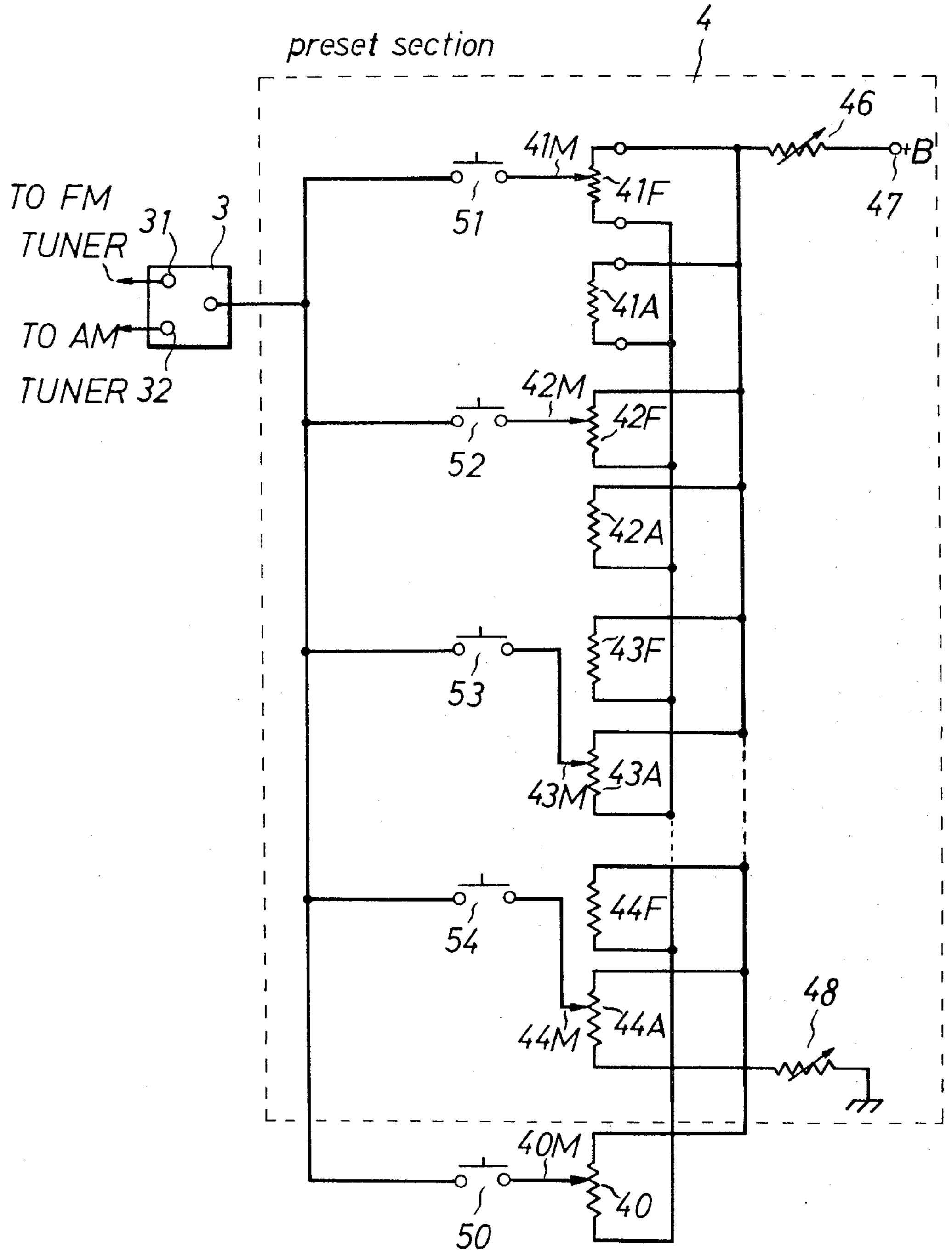
FIG. 9 shows a connection diagram of a modified preset member.

In the embodiment shown in FIG. 9, each of the variable resistors 41 to 44 shown in FIG. 1 is comprised by two resitive members which are connected in parallel and are varied by a common sliding arm sliding through two bodies. For example, the resistor associated with push button switch 51 comprises two parallel connected resistor bodies 41F and 41A and a single sliding arm 41M cooperating with these resitive members 41F and 41A. Resistor 41F is used for presetting the FM tuner when FM-AM change-over switch 3 is thrown to contact 31, whereas resistor body 41A is used for presetting the AM tuner when FM-AM change-over switch 3 is thrown to contact 32. Other resistor members 42F, 42A, 43F, 43A, 44F, 44A are used in the same manner.

The circuit diagram shown in FIG. 9 illustrates to a slight modification of the circuit shown in FIG. 6 in such a way that the panel board shown in FIG. 7 and can be used in a receiver utilizing the circuit shown in FIG. 7.

In the same manner, each of the variable registors shown in FIG. 8 can be comprised of two independent variable resistors which are connected in parallel across a source.

Figure 10:
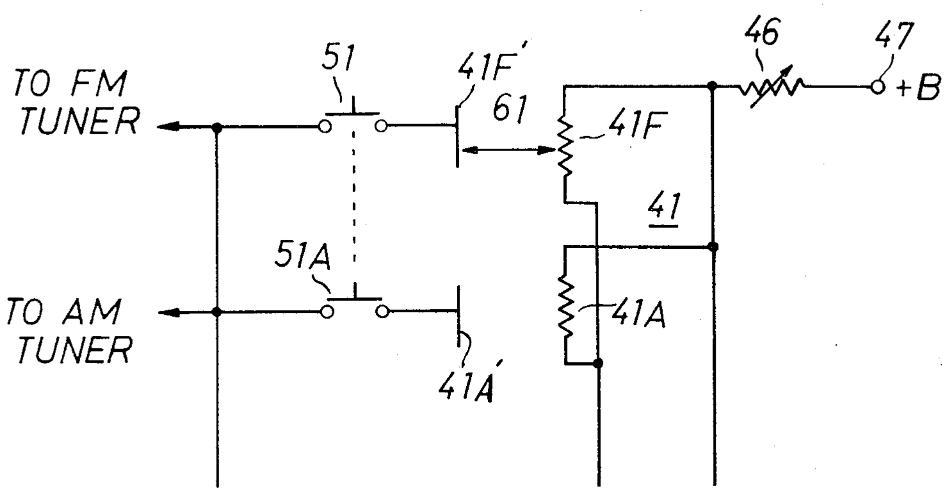
FIG. 10 is a partial view to illustrate a modification of the circuit shown in FIG. 8.

FIG. 10 shows one of such resistors, 41 for example. The resistor comprises a upper section 41F for FM presetting and a lower section 41A for AM presetting. Contact pieces 41F' and 41A' are disposed to extend in parallel with sections 41F and 41A respectively and a sliding arm 61 is provided to move between upper section 41F and contact piece 41F' and between lower section 41A and contact piece 41A'.

While the invention has been shown and described in terms of preferred embodiments thereof it will be clear that many changes and modifications may be made within the true spirit and scope of the invention as defined in the appended claims.

What is claimed is

1. In an FM-AM preset tuning circuit combination provided with an FM tuner including: a plurality of tank circuits each having a tuning frequency determining element controlled by a direct current voltage impressed thereto; an AM tuner including a plurality of tank circuits each having a tuning frequency determining element controlled by a direct current voltage impressed thereon; preset circuit means including a plurality of voltage adjusting means for adjusting the direct current voltage impressed upon respective tuning frequency determining elements included in said tank circuits of said FM and said AM tuners, respectively, for pretuning said tank circuits to the frequencies of select FM and AM broadcasting stations, and a plurality of switch means in circuit relation with each one of said voltage adjusting means and at least one FM-AM change-over switch means connected in circuit relation with said FM and AM tuners being selectively connectable in combination with said preset circuit means to either one of said FM and AM tuners.

2. An FM-AM preset tuning device according to claim 1 wherein said FM and AM tank circuits, respectively, include two tuning frequency determining elements controlled by direct current voltage impressed thereon and having junctures therebetween commonly connected in circuit to respective contacts of said FM-AM change-over switch means to enable selective energization of said preset means.

3. An FM-AM preset tuning device according to claim 1 wherein preset means comprises a plurality of variable resistors connected in parallel across a direct current source wherein said variable resistors are provided with movable taps connected to a movable contact of said FM-AM change-over switch through respective switch means.

4. The FM-AM preset tuning device according to claim 1 wherein said voltage adjusting means comprises a plurality of variable resistors connected across a source and having sliding arms, the mid points of said variable resistors being connected to one terminal of said source, said sliding arms being adjustable on the opposite sides of said mid points, and a plurality of scale boards corresponding to said variable resistors: each of scale boards having a scale along its side, one half of said scale being graduated with an FM scale and the other half with an AM scale.

5. The FM-AM preset tuning device according to claim 1 wherein each of said voltage adjusting means comprises two independent parallel resistors which are varied by a single sliding arm.

6. An FM-AM preset tuning device comprising an FM tuner including a plurality of tank circuits each having a tuning frequency determining element controlled by a direct current voltage impressed thereto; an AM tuner including a plurality of tank circuits each having a variable capacitance diode; preset circuit means including a plurality of voltage adjusting means for adjusting the direct current voltage impressed upon respective tuning frequency determining elements included in said tank circuits of said FM and said AM tuners, respectively, for pretuning said tank circuits to the frequencies of select FM and AM broadcasting stations, and a plurality of switch means in circuit relation with each one of said voltage adjusting means; wherein each one of said voltage adjusting means comprises a variable resistor having its mid point connected to one side of a source and its opposite terminals connected to the other side of said source, a sliding arm sliding along said variable resistor, two spaced apart contact members, one of said contact members extending along one half of said variable resistor and the other extending along the other half of said variable resistor to be contacted by said sliding arm, a first switch connected between said FM tuner and one of said contact members and a second switch connected between said AM tuner and the other of said contact members.

7. The FM-AM preset tuning device according to claim 6 wherein said variable resistor comprises two sections connected in parallel across a source, a first resistor section extending parallel with the first of said contact members; a second resistor section extending parallel with another of said contact members; and a single sliding arm movable between said first resistor section and said first contact member, as well as, between said second resistor section and the other contact member.

* * * * *

PO-1050
(5/69)

UNITED STATES PATENT OFFICE
CERTIFICATE OF CORRECTION

Patent No. 3,755,763 Dated August 28, 1973

Inventor(s) JURO HOSHI

It is certified that error appears in the above-identified patent and that said Letters Patent are hereby corrected as shown below:

In the heading to the printed specification;

Line 3, "Assignee: Nippon Bakki Seizo Kabushiki" should read --Nippon Gakki Seizo Kabushiki--.

Line 4, "Kaisha, Shiznoka-Ken, Japan" should read, --Kaisha, Shinzuoka-Ken, Japan--.

Also to be included: --Foreign Application Priority Data:

| | | |
|---|---|---|
| March 25, 1970 | Japanese | 45-27840 |
| April 6, 1970 | Japanese | 45-33004 |
| April 8, 1970 | Japanese | 45-33383 |
| April 4, 1970 | Japanese | 45-32462 |
| April 6, 1970 | Japanese | 45-33005 |
| April 10, 1970 | Japanese | 45-34609--. |

Signed and sealed this 16th day of April 1974.

(SEAL)
Attest:

EDWARD M. FLETCHER, JR.
Attesting Officer

C. MARSHALL DANN
Commissioner of Patents